US010231353B2

(12) United States Patent
Giroux

(10) Patent No.: US 10,231,353 B2
(45) Date of Patent: *Mar. 12, 2019

(54) PATCH PANEL ASSEMBLY

(71) Applicant: Amazon Technologies, Inc., Seattle, WA (US)

(72) Inventor: Brandyn David Giroux, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/823,253

(22) Filed: Nov. 27, 2017

(65) Prior Publication Data

US 2018/0084664 A1  Mar. 22, 2018

Related U.S. Application Data

(63) Continuation of application No. 15/083,203, filed on Mar. 28, 2016, now Pat. No. 9,832,904.

(51) Int. Cl.
*H01R 13/60* (2006.01)
*H05K 7/14* (2006.01)
*G02B 6/44* (2006.01)
*H04Q 1/02* (2006.01)

(52) U.S. Cl.
CPC ......... *H05K 7/1489* (2013.01); *G02B 6/4452* (2013.01); *H04Q 1/13* (2013.01); *H05K 7/1491* (2013.01)

(58) Field of Classification Search
CPC .. H01R 13/518; H01R 13/514; H01R 23/025; H04Q 1/142; G02B 6/3897
USPC ............... 439/540.1, 557; 174/101
See application file for complete search history.

(56) References Cited

U.S. PATENT DOCUMENTS

| | | | | | |
|---|---|---|---|---|---|
| 4,497,411 A | * | 2/1985 | DeBortoli | ............... | H05K 7/186 |
| | | | | | 211/189 |
| 5,639,261 A | * | 6/1997 | Rutkowski | ........... | G02B 6/4452 |
| | | | | | 439/31 |
| 5,647,763 A | * | 7/1997 | Arnold | ................. | G02B 6/3897 |
| | | | | | 439/532 |
| 5,765,698 A | * | 6/1998 | Bullivant | ............. | H01R 9/2416 |
| | | | | | 211/26 |

(Continued)

FOREIGN PATENT DOCUMENTS

JP         11089053         3/1999

OTHER PUBLICATIONS

U.S. Appl. No. 13/780,495, filed Feb. 28, 2013, Schow, et al.

(Continued)

*Primary Examiner* — Abdullah A Riyami
*Assistant Examiner* — Vladimir Imas
(74) *Attorney, Agent, or Firm* — Robert C. Kowert; Meyertons, Hood, Kivlin, Kowert & Goetzel, P.C.

(57) ABSTRACT

A patch panel assembly mounts in a rack on a side of the rack other than the front side of the rack and other than the back side of the rack and fits within a volume of space not occupied by rack slots of the rack. In some embodiments the patch panel assembly includes brackets that articulate into out of the volume of space in the rack in which the patch panel assembly is mounted to allow access to patch cable connectors coupled in the brackets of the patch panel assembly.

20 Claims, 6 Drawing Sheets

(56) References Cited

U.S. PATENT DOCUMENTS

| | | | | |
|---|---|---|---|---|
| 6,819,856 B2* | 11/2004 | Dagley | ................ | G02B 6/4452 385/134 |
| 6,971,909 B2* | 12/2005 | Levesque | ............... | H04Q 1/068 385/134 |
| 7,087,840 B2* | 8/2006 | Herring | ................ | H02G 3/0431 174/101 |
| 7,220,145 B2* | 5/2007 | Denovich | ............ | G02B 6/4452 439/540.1 |
| 7,335,056 B1* | 2/2008 | Clark | ................... | H01R 13/518 439/534 |
| 7,345,241 B2* | 3/2008 | Caveney | .............. | H01R 9/2416 174/135 |
| 7,362,941 B2* | 4/2008 | Rinderer | ................ | H05K 7/186 385/134 |
| 7,455,548 B2* | 11/2008 | Clark | ................... | H01R 13/518 439/247 |
| 7,510,421 B2* | 3/2009 | Fransen | ............... | H01R 9/2416 439/449 |
| 7,534,958 B2* | 5/2009 | McNutt | ................ | G02B 6/3897 174/101 |
| 7,687,716 B2* | 3/2010 | Pepe | ...................... | H04Q 1/142 174/101 |
| 7,916,502 B2* | 3/2011 | Papakos | ............... | H05K 7/1425 174/72 A |
| 8,040,693 B2* | 10/2011 | Blomquist | ............... | H04Q 1/02 174/481 |
| 8,254,148 B2* | 8/2012 | Hsiao | ................... | H05K 7/1491 361/802 |
| 8,300,390 B2* | 10/2012 | Wu | ........................ | G06F 1/183 174/50 |
| 8,737,090 B2* | 5/2014 | Jai | ....................... | H05K 7/1491 211/26 |
| 8,851,902 B2* | 10/2014 | Shifris | ............... | H01R 13/6658 439/65 |
| 9,282,660 B2* | 3/2016 | Bailey | ................... | H05K 5/023 |
| 9,832,904 B1 | 11/2017 | Giroux | | |
| 2010/0264788 A1* | 10/2010 | Adducci | ................ | H02B 1/202 312/223.2 |

OTHER PUBLICATIONS

"Tutorials of Fiber Optic Products," downloaded from http://www.fiber-optic-tutorial.com/how-to-select-the-right-fiber-patch-cable-for-40g-qsfp-transceiver.html Mar. 2, 2016, pp. 1-4.

"LC Connector Definition from PC Magazine Encyclopedia," downloaded from http://www.pcmag.com/encyclopedia/term/45971/lc-connector on Mar. 2, 2016, pp. 1-8.

* cited by examiner

PATCH PANEL ASSEMBLY

This application is a continuation of U.S. patent application Ser. No. 15/083,203, filed Mar. 28, 2016, now U.S. Pat. No. 9,832,904, which is hereby incorporated by reference herein in its entirety.

BACKGROUND

Many companies and other organizations operate computer networks that interconnect numerous computing systems to support their operations and the services they provide to their end customers distributed worldwide. For example, data centers housing significant numbers of interconnected computing systems have become commonplace, such as private data centers that are operated by and on behalf of a single organization, and public data centers that are operated by entities as businesses to provide computing resources to customers.

In data centers, a significant number of network connections may be required in each server rack. Each rack in a data center may, for example, include a switch that has a receptacle panel for plugging in numerous network connector plugs. Also, some racks may include additional networking equipment mounted in the rack, such as additional switches, routers, etc. In some data centers, cabling may be routed from cable trays, conduits, etc. in the data center to switches or other networking equipment in a rack. In order to route the cabling to the switches and other networking equipment, cables may be routed from the cable trays or conduits to connection points on switches and other network equipment mounted within the rack after the rack is installed. Such routing of cables within a rack after installation of a rack may be labor intensive and susceptible to errors in installation. Alternatively cables may be routed to connection points on switches and other network equipment mounted in a rack by routing cables external to the rack to the connection points on the switches and other pieces of network equipment. However, cables routed external to the rack may interfere with access to components mounted in the rack and may be difficult to manage. As another alternative, some data centers may use patch panels that are mounted in a slot of a rack, wherein cables from cables trays or conduits connect to the patch panel and patch cables are routed within the rack from the patch panel to connection points on switches and other networking equipment mounted within the rack. However, patch panels mounted in slots of a rack may occupy space in a rack that could be used to mount additional computing devices, switches, or other pieces of network equipment in the rack.

Figure 1A:
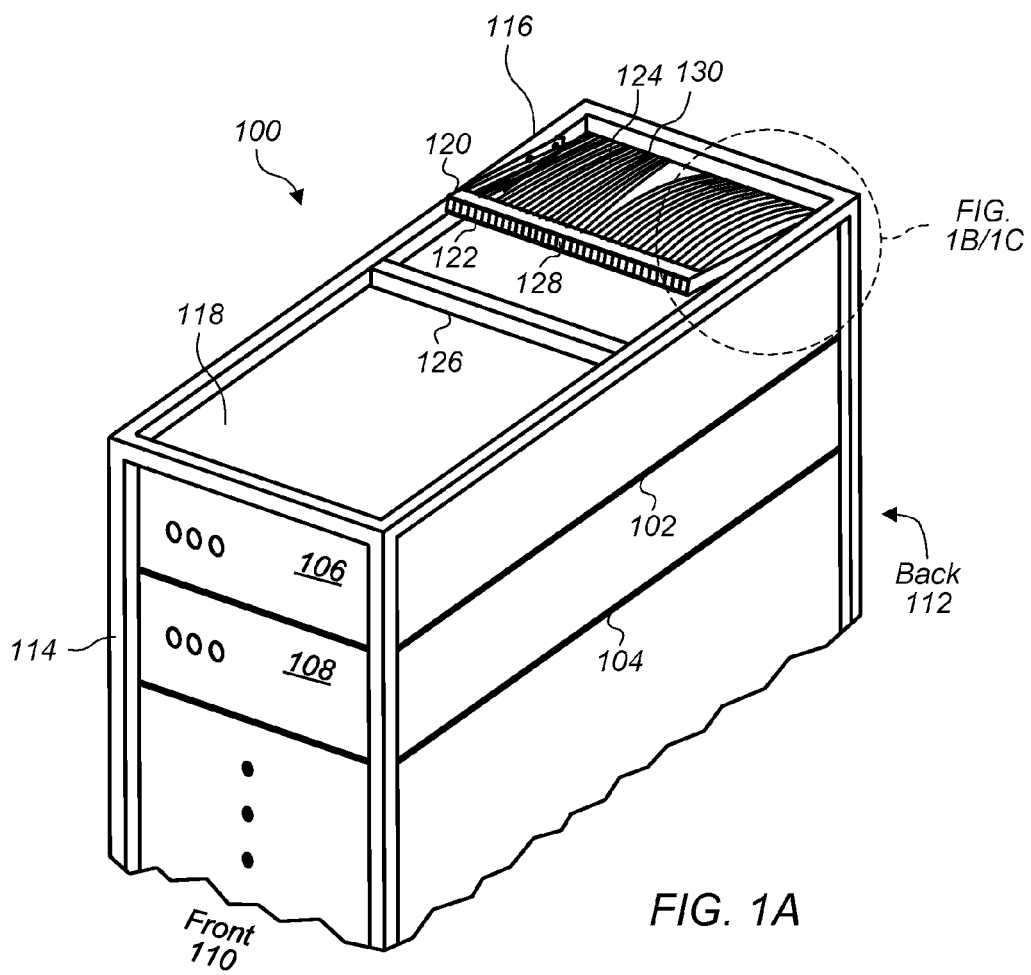
FIG. 1A illustrates a perspective view of a rack including a patch panel assembly, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of patch panel assemblies with articulating brackets and methods of installing racks that include patch panel assemblies with articulating brackets are described. According to one embodiment, a rack includes rack slots configured to accept computing devices. The rack slots extend between a front side of the rack and a back side of the rack and are configured to accept installation or removal of computing devices in the rack via the front side of the rack or via the back side of the rack. For example, a rack may be a rack in accordance with an Electronic Industries Alliance (EIA) standard for 19" racks with 1 U, 2 U, 1.5 U, etc. rack slots that are configured to accept computing devices such as servers and/or networking equipment such as network switches that are to be mounted in the rack slots. In some embodiments, a rack may be a non-standard rack. The rack also includes a patch panel assembly mounted in the rack, wherein the patch panel assembly includes a bracket including one or more openings configured to accept patch cable connectors. For example, a bulkhead connector of a patch cable may be secured in an opening of the bracket of the patch panel assembly. The rack also includes a passage configured for routing respective patch cables from respective ones of the rack slots to the patch panel assembly. For example, a rack may include a network switch installed in the rack and may include a passage through the rack from the network switch to the patch panel assembly in which patch cables that connect the network switch to the patch panel assembly are routed. The patch panel assembly is mounted on a top side of the rack that is different than the front side of the rack and different than the back side of the rack such that the patch panel assembly does not occupy space in the rack occupied by the rack slots of the rack. For example, the patch panel assembly may be mounted in a volume of space on the top side of the rack above the uppermost rack slot of the rack and not occupy space in the rack corresponding to the uppermost rack slot.

According to one embodiment, a device includes a patch panel assembly configured to be mounted in a rack, wherein the patch panel assembly includes a bracket including one or more openings that are configured to accept patch cable connectors in the one or more openings. The patch panel assembly is configured to be mounted in a volume of space in the rack on a side of the rack other than a front side of the rack and other than a back side of the rack such that the patch panel assembly does not occupy a rack slot of multiple rack slots of the rack that are configured to accept computing devices.

According to one embodiment, a method includes providing a rack comprising multiple rack slots at a data center location, wherein the rack slots extend between a front side of the rack and a back side of the rack, and wherein the rack comprises a patch panel mounted in the rack on another side of the rack other than the front side of the rack and other than the back side of the rack, wherein the patch panel does not occupy space in the rack occupied by the rack slots of the rack; and articulating a bracket of the patch panel from a closed position to an open position such that patch cable connectors mounted in one or more openings in the bracket of the patch panel are accessible. For example, the bracket of the patch panel may be articulated into the open position such that patch cable connectors coupled in the one or more openings of the bracket are accessible to be couple with connectors of patch cables that are outside of the rack.

As used herein, a "cable" includes any cable or line that carries one or more conductors or fiber optic elements and that is flexible over at least a portion of its length. A cable may include a connector portion, such as a plug, at one or more of its ends.

As used herein, "computing device" includes any of various devices in which computing operations can be carried out, such as computer systems or components thereof. One example of a computing device is a rack-mounted server. Other examples include a network switch, a router, or other networking equipment. As used herein, the term computing device is not limited to just those integrated circuits referred to in the art as a computer, but broadly refers to devices including a processor, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "connector" of a cable means any element or device on a cable that can be used to electrically or optically connect the cable with another device or element.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "pivot mechanism" includes any element configured to allow two members that are coupled together to move relative to each other. For example a pivot mechanism may include a screw passing through a hole in a bracket, a pin passing through a hole in a bracket, a bearing coupled between a structural member and a bracket that allows the bracket to move relative to the structural member, or other suitable mechanisms that allow a bracket coupled to a structural member to move relative to the structural member.

As used herein, a "securing mechanism" includes an element configured to maintain a bracket of a patch panel assembly in an open position or in a closed position. For example, a securing mechanism, may include a pin that fits within a hole in a bracket of a patch panel assembly, a detent mechanism, a stop, or other suitable mechanisms for securing a bracket of a patch panel assembly in an open or closed position. In some embodiments, a patch panel assembly may include multiple securing mechanism for holding a bracket of the patch panel assembly in multiple positions.

As used herein, a "structural member" of a rack includes members of a frame of a rack that provide structural support for the rack. For example, a structural member may include structural tubing that makes up a frame of a rack. In some embodiments, other types of structural elements other than structural tubing may be used to make up a frame of a rack and a structural member may be any of the elements that make up the frame of the rack.

Some data centers may include racks that include computing devices, network switches, and other networking equipment mounted in the racks, wherein cables connect the components mounted in the rack to networks outside of the rack, such as connections to a data center network. Such cables may be routed from a source outside of a rack to respective components mounted in the rack, and may be directly connected to the respective components mounted in the rack. For example, a cable connecting a component in a rack may be routed to a front face of a component mounted in the rack or may be routed within a rack to a particular component mounted in the rack. However, such configurations may require significant time and manpower to route cables within a rack to respective components mounted in a rack. Also, routing cables to a front or back face of a component mounted in one or more rack slots of a rack may block access to other components mounted in other rack slots of the rack. It may also block airflow to other components mounted in other rack slots of the rack or may result in unnecessary clutter in a data center.

Some data centers may utilize patch panels, wherein a patch panel is mounted in one or more rack slots of a rack. A patch cable may provide a connection within the rack from components mounted in the rack to the patch panel and the patch panel may provide an organized set of connectors for connecting the components mounted in the rack with networks or other devices outside of the rack. However, in such arrangements the one or more rack slots of the rack in which the patch panels are mounted may occupy valuable space in the rack in which additional computing devices, such as servers, and/or networking devices, such as switches could be mounted. Thus patch panels mounted in rack slots may reduce a number of computing devices and/or network devices that can be mounted in a rack by occupying space that otherwise could be used to increase rack density by including additional computing devices or additional network devices.

In some embodiments, a rack may include a patch panel assembly that is mounted on a side of the rack other than the front side of the rack and other than the back side of the rack. Such a patch panel assembly may not occupy a rack slot or interfere with installing computing device and/or network equipment in rack slots of a rack. For example, in some embodiments, a patch panel assembly may be mounted on a top side of a rack, thus not occupying valuable space on a front side of the rack or occupying valuable space on a back side of the rack and may not interfere with installation of computing devices or network devices in rack slots that extend between the front side of the rack and the back side of the rack. Also, the patch panel assembly may be mounted in a volume of space in the rack that is separate from volumes of space in the rack occupied by the rack slots of the rack. In some embodiments, a patch panel may include articulating members, such as an articulating bracket. The articulating members may allow components of the patch panel assembly, such as an articulating bracket, to fit within the rack in the volume of space separate from the rack slots without extending beyond an outer edge of a frame of the rack. This may permit racks to be shipped via established shipping methods without a need to adjust for different rack dimensions. Also, an articulating member of a patch panel assembly, such as an articulating bracket, may articulate and extend beyond an outer edge of a frame of a rack in order to allow access to cable connectors coupled in the articulating member. Thus a patch panel assembly with an articulating member may be mounted in a rack without increasing the overall dimensions of a rack, for example without increasing a height dimension of a rack, but may also allow access to patch cable connectors mounted in the articulating member of the patch panel assembly by articulating the articulating member beyond an outer edge of a frame of the rack.

FIG. 1A illustrates a perspective view of a rack including a patch panel assembly, according to some embodiments. Rack 100 includes rack slots 102 and 104 extending between a front side 110 of rack 100 and a back side 112 of rack 100. An ellipses in FIG. 1A indicates that rack 100 may include any number of rack slots. In addition, computing devices 106 and 108 are mounted in rack slots 102 and 104. Also rack 100 includes a rack frame 114 comprising structural members, such as structural member 126. Patch panel assembly 116 is mounted on top side 118 of rack 100. Patch panel assembly 116 includes bracket 120, wherein bracket 120 includes openings 122 in which bulkhead connectors 128 of patch cables 124 are mounted. In some embodiments, patch panel assembly 116, when in a closed position fits within a volume of space in rack 100 with a depth defined by the thickness of structural member 126. For example, in some embodiments, structural member 126 may be a structural tube, such as steel tube with a height (or thickness) of 1" and patch panel assembly 116 may fit within a volume of space that has a depth not greater than the thickness of structural member 126, for example a depth not greater than 1." In some embodiments a rack may include structural members of different thickness and a patch panel assembly may fit within a volume with a different depth. In some embodiments, a patch panel assembly may have a depth that is slightly greater than a thickness of a structural member of a rack but nevertheless not extend into a compute space of rack slots of the rack, since the space at the very top of the rack may not be reserved as compute space (e.g., because that space is too narrow to serve as compute space).

In the closed position bracket 120 may not extend beyond an outer edge of frame 114 of rack 100. For example, in the closed position bracket 120 may not extend beyond a top surface of structural member 126. In the open position, a bracket of a patch panel, such as bracket 120, may articulate out of the volume of space in which the bracket is located in the closed position to allow access to one or more openings in the bracket in which connectors of patch cables are mounted. For example, bracket 120 includes openings 122 and patch cable connectors 128 of cables 124 are coupled in openings 122 of bracket 120. In the open position, bracket 120 may be articulated away from frame 114 of rack 100 to better allow connectors of respective data center cables to be coupled with patch cable connectors 128 mounted in openings 122 of bracket 120. In some embodiments, a rack, such as rack 100, may include a passage, such as passage 130 through which patch cables that have one end mounted in a patch panel assembly, such as patch panel assembly 116, are routed to respective components to which the patch cables are connected at another end, such as computing devices 106 and 108. In some embodiments, a patch panel assembly, such as patch panel assembly 116, may be mounted on a side of a rack other than a top side of the rack, for example a patch panel assembly may be mounted on a left side, right side, or bottom side of a rack.

Figure 1B:
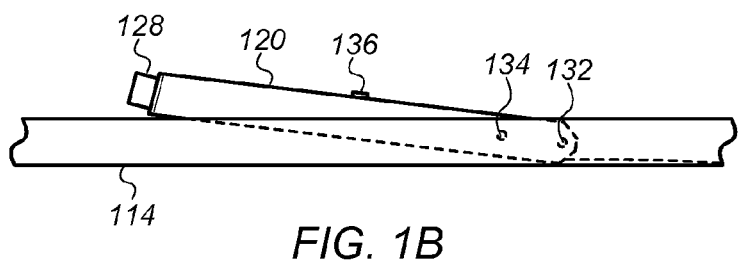
FIG. 1B illustrates an enlarged side view of a bracket of patch panel assembly in an open position, according to some embodiments.

FIG. 1B illustrates an enlarged side view of a bracket of patch panel in an open position, according to some embodiments. As can be seen in FIG. 1*b*, patch cable connector 128 is articulated above frame 114 so that patch cable connector 128 is accessible for coupling with a cable connector of a cable outside of rack 100.

In some embodiments, a patch panel assembly, such as patch panel assembly 116, may include a pivot mechanism, such as pivot mechanism 132, that couples a bracket, such as bracket 120, to a frame of a rack, such as frame 114 of rack 100. A pivot mechanism may include a screw that passes through a hole in a bracket to form a pivot mechanism. In some embodiments, other suitable pivot mechanisms may be used such as a bearing, a pin a rod, etc. In addition, a patch panel assembly may include one or more securing mechanisms for securing a bracket of a patch panel in one or more open or closed positions. For example, bracket 120 includes securing mechanism 134. Securing mechanism 134 may be a hole in the bracket through which a pin is inserted to maintain the bracket in an open position, securing mechanism 134 may also be a detent mechanism that includes a spring loaded ball that engages with a indention in a frame of a rack, or may include other suitable mechanisms for securing a bracket in an open position. In some embodiments, a patch panel assembly may be configured to be secured in multiple open positions. For example, bracket 120 may include multiple securing mechanisms 134 configured to maintain bracket 120 at different heights when in different open positions.

Figure 1C:
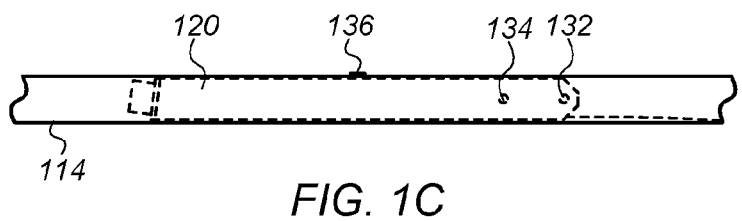
FIG. 1C illustrates an enlarged side view of a bracket of patch panel assembly in a closed position, according to some embodiments.

FIG. 1C illustrates an enlarged side view of a bracket of patch panel assembly in a closed position, according to some embodiments. A securing mechanism, such as securing mechanism 136, may include a stop that prevents a bracket of a patch panel assembly, such as bracket 120, from falling below a frame of a rack in which the patch panel assembly is mounted, such as frame 114. For example, securing mechanism 136 may be a stop that overhangs from bracket 120 such that as bracket 120 is rotated into the closed position the stop engages with frame 114 and prevents bracket 120 from further rotating past the closed position. As can be seen in FIG. 1C, a bracket of a patch panel assembly, such as bracket 120 may have a height such that the bracket and the patch panel assembly do not extend beyond un outer edge of a frame of a rack when in the closed position. For example, bracket 120 does not extend above the top edge of frame 114 when in the closed position. Also, as shown in FIG. 1A, a rack slot of a rack, such as rack slot 102 of rack 100 may be bound on a top side by a bottom side of a structural member of a frame of rack. For example, the bottom surface of structural member 126 may interface with a top surface of a rack slot, such as rack slot 102. However, the space that corresponds to the thickness of the structural member may not be part of a rack slot and may be occupied by a patch panel without interfering with the rack slot and without adding additional height to a rack.

Figure 2:
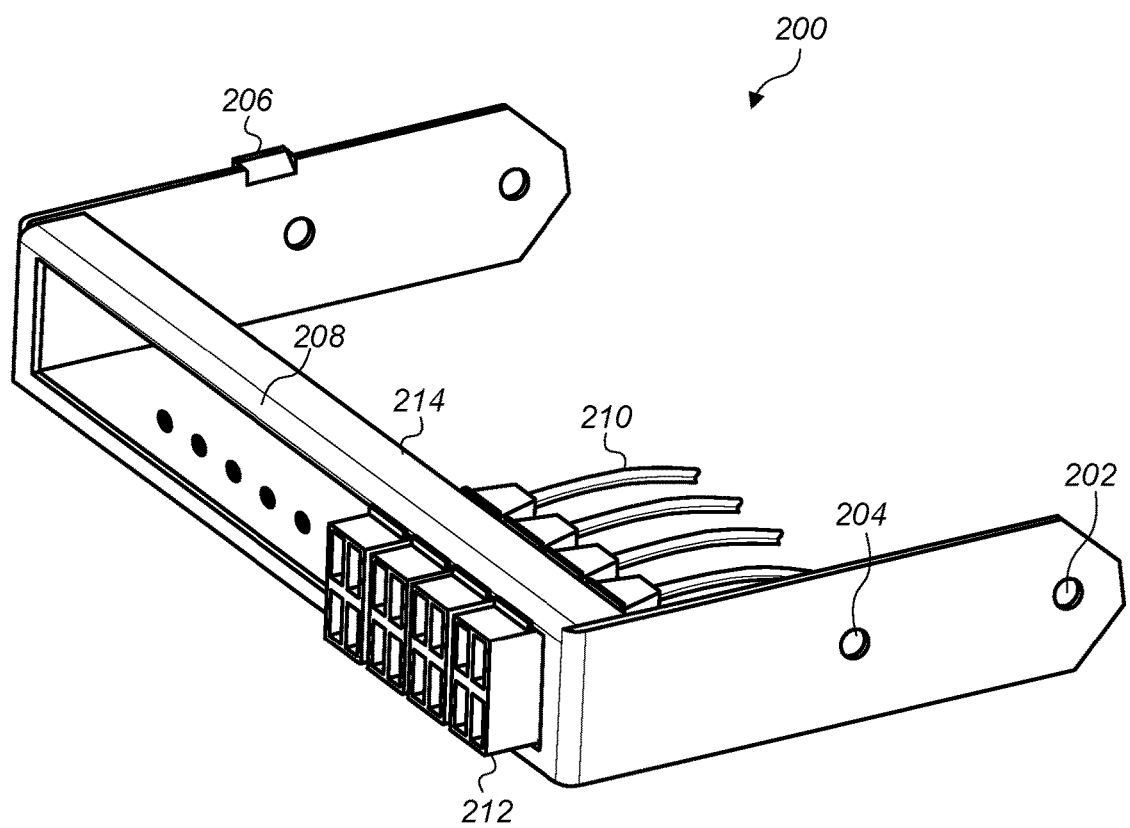
FIG. 2 illustrates a bracket of a patch panel assembly including bulkhead connectors of patch cables coupled in the bracket of the patch panel assembly, according to some embodiments.

FIG. 2 illustrates a bracket of a patch panel assembly including bulkhead connectors of patch cables coupled in the bracket of the patch panel assembly, according to some embodiments. Bracket 200 includes holes 202 for accepting a pivot mechanism, such as a pin or screw. Bracket 200 also includes holes 204 for accepting a securing mechanism such as a pin, retaining clip, detent mechanism, or other suitable securing mechanism. In some embodiments, a bracket, such as bracket 200, may include multiple sets of holes 204 in different locations along the bracket in order to allow the bracket to be secured in multiple open positions. Bracket 200 also includes stop 206. Stop 206 is an example of a securing mechanism that may be used in a patch panel assembly with an articulating bracket to hold the bracket in place when in a closed position such that the bracket does not rotate into a space in the rack below where the bracket is mounted. In addition, bracket 200 includes opening 208. In some embodiments, a bracket of a patch panel assembly, such as bracket 200 may include an opening that accepts multiple patch cable connectors, such as opening 208 illustrated in FIG. 2. In some embodiments, a bracket of a patch panel assembly, such as bracket 200, may include multiple openings wherein each opening accepts one or more patch cable connectors.

FIG. 2 illustrates patch cables 210 that include patch cable connectors 212 installed in bracket 200. In some embodiments, a bracket such as bracket 200 may include a lip, such as lip 214 that is configured to engage with a patch cable connector plug to secure the patch cable connector plug in the opening of the bracket of the patch panel assembly. In some embodiments, respective patch cable connectors may be identified by one or more labels affixed to a lip, such as lip 214. Various types of patch cables and patch cable connectors may be installed in a bracket of a patch panel assembly, such as bracket 200. For example, FIG. 2 illustrates fiber optic patch cables that include patch cable connectors plugs with multiple fiber optic connectors in a common bulkhead connector. In some embodiments, patch cables, such as cables 210 may be copper cables or other types of cables and various assortments of connector plugs and/or receptacles may be included with the patch cables and may be secured in an opening of a bracket of a patch panel assembly. Bracket 200 illustrated in FIG. 2 may be any of the brackets included in patch panels described in FIGS. 1 and 3-6.

Figure 3A:
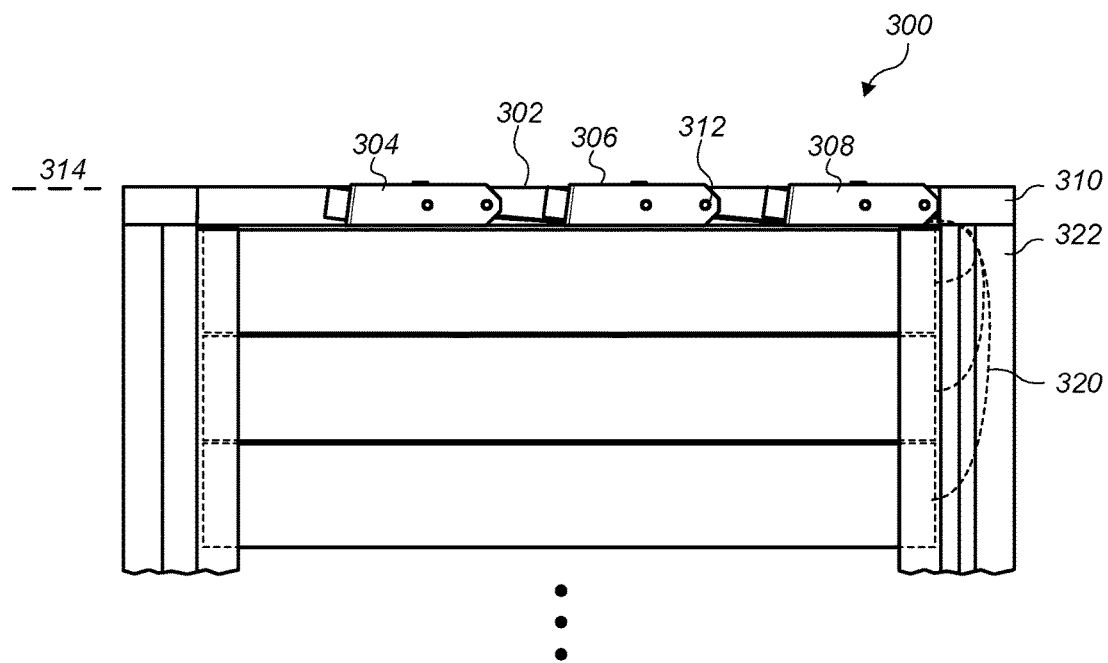
FIG. 3A illustrates a side view of a patch panel assembly mounted in a rack that includes multiple articulating brackets in closed positions, according to some embodiments.
Figure 3B:
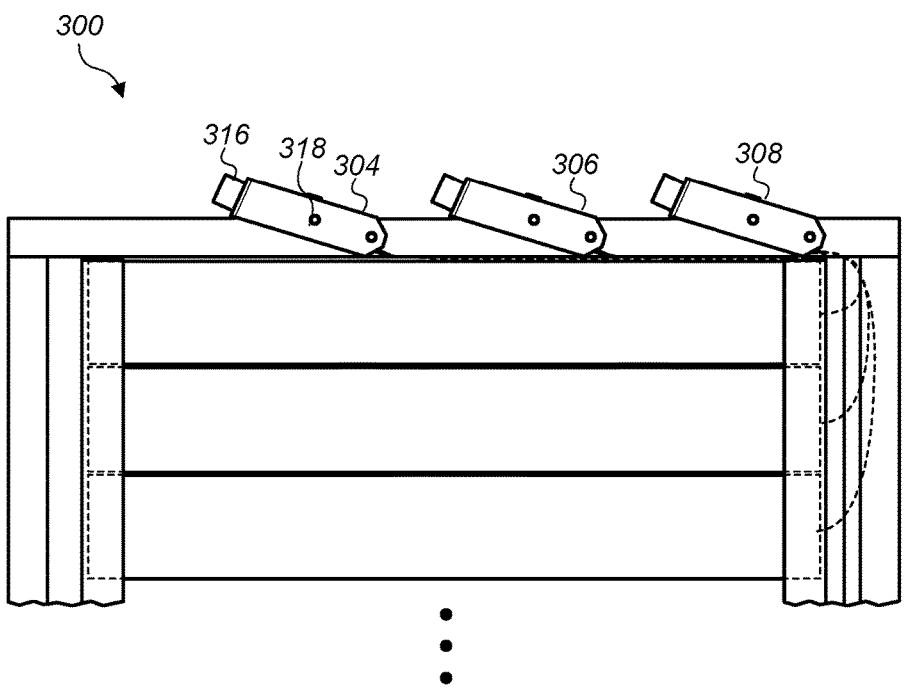
FIG. 3B illustrates a side view of a patch panel assembly mounted in a rack that includes multiple articulating brackets in open positions, according to some embodiments.

In some embodiments, a patch panel assembly mounted in a rack may include multiple articulating brackets mounted within a volume of space whose depth is defined by a thickness of a structural member of the rack. For example, FIG. 3A illustrates a side view of a patch panel assembly mounted in a rack that includes multiple articulating brackets in closed positions, according to some embodiments. Rack 300 includes path panel assembly 302 that includes brackets 304, 306, and 308 coupled to structural member 310 of rack 300 via pivot mechanisms 312. Brackets 304, 306, and 308 are illustrated in a first position or closed position in which the brackets fit within a volume of space whose depth is defined by the thickness of structural member 310 and do not extend beyond outer edge 314 of rack 300. FIG. 3B illustrates a side view of the same patch panel as illustrated in FIG. 3A with the multiple articulating brackets in open positions, according to some embodiments. Brackets 304, 306, and 308 in FIG. 3B are articulated out of rack 300 as compared to FIG. 3A and patch cable connectors 316 mounted in brackets 304, 306, and 308 are accessible to accept corresponding cable connectors when positioned in the open position. In some embodiments, a securing mechanism, such as pin, may be inserted through holes 318 of brackets 304, 306, and 308 to secure the brackets in the open position. In some embodiments, brackets 304, 306, and 308 may be secured in different open positions independently of each other. For example, in some embodiments, bracket 308 may be articulated further out of rack 300 than bracket 306.

In some embodiments a patch panel assembly may include a cable management panel coupled to a bottom side of the patch panel assembly between a bracket of the patch panel and a rack slot of a rack in which the patch panel is mounted. A cable management panel may prevent patch cables from intruding into rack slots below the patch panel assembly and may include cable guides that guide patch cables mounted in the patch panel assembly as a bracket of the patch panel assembly is articulated into and out of a rack. In some embodiments, patch cables may be fiber optic cables and a cable management panel may guide the cables such that a desired minimum bend radius is maintained for the cables as a bracket of the patch panel is articulated into and out of a rack.

Figure 4:
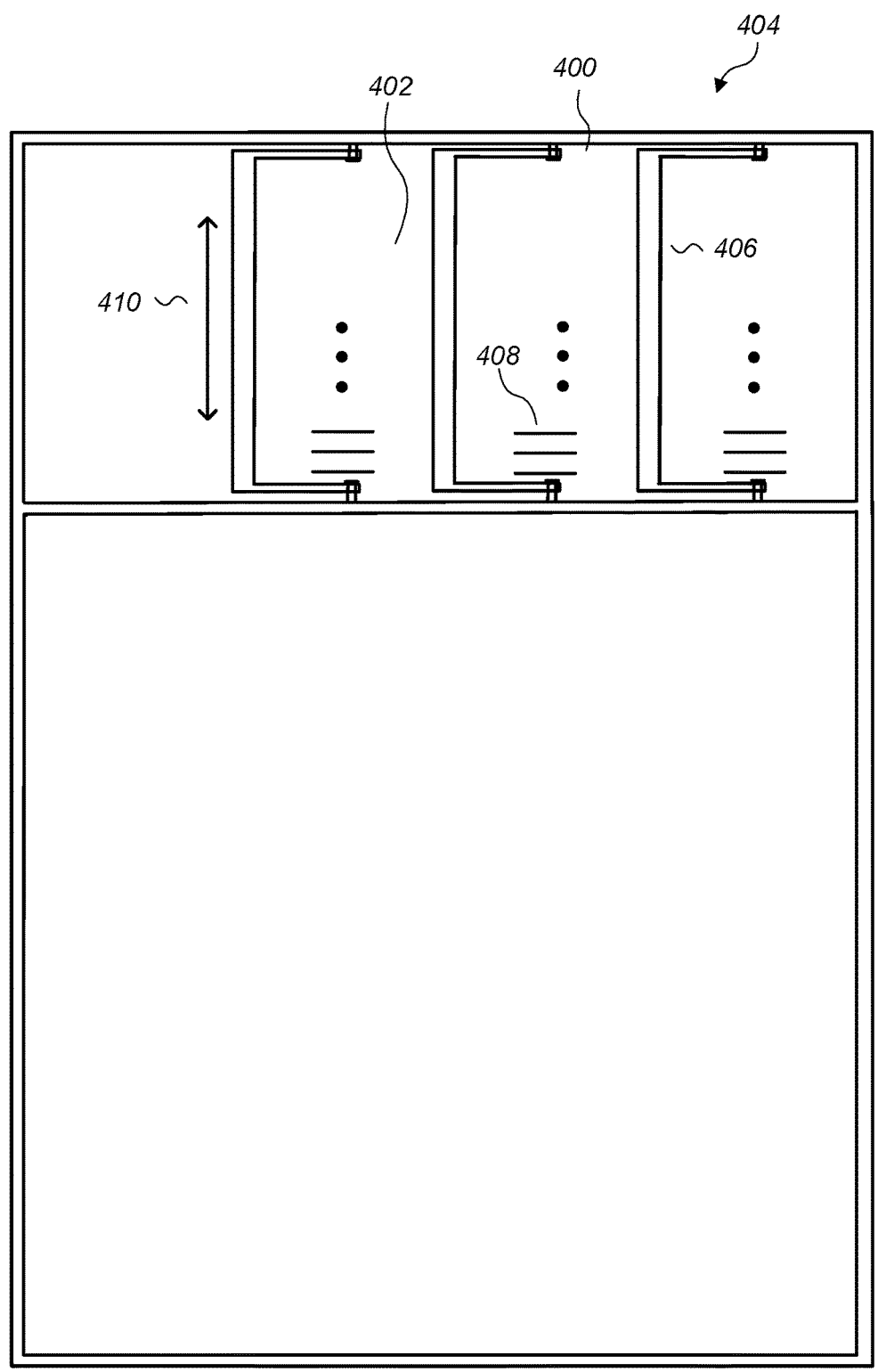
FIG. 4 is a top view illustrating a patch panel assembly that includes multiple articulating brackets mounted in a rack, according to some embodiments.

FIG. 4 is a top view illustrating a patch panel assembly that includes multiple articulating brackets mounted in a rack, according to some embodiments. Patch panel assembly 400 includes cable management panel 402 coupled below brackets 406. Cable management panel 402 includes cable guides 408 that are configured to guide cables mounted in brackets 406 as the brackets are articulated. In some embodiments, a cable management panel may not include cable guides, in some embodiments, a cable management panel may be a metal sheet that is mounted below brackets of a patch panel to separate the patch panel from rack slots in a rack below the patch panel. In some embodiments, a cable management panel may be made out any suitable material, such as metal, plastic, or other polymers. In some embodiments cable guides may be bars or pins that are mounted on a cable management panel. In some embodiments, cable guides may have a curved shape to guide fiber optic cables such that a minimum bend radius is maintained.

In some embodiments, brackets of a patch panel assembly may be mounted in a rack such that patch cable connectors mounted in one or more openings of the brackets are oriented in lines that are perpendicular to a front face of a rack. For example, patch cable connectors may be secured in brackets 406 along line 410 that runs perpendicular to front face 412 of rack 404. In some embodiments, a patch panel assembly may include any number of brackets. In some embodiments, a patch panel assembly may include a bracket mounted in a rack such that patch cable connectors mounted in one or more openings of the bracket are oriented in a line parallel to a front face of a rack. For example, in FIG. 1 bracket 120 is mounted in rack 100 such that patch cable connectors 128 are oriented in a line parallel to front face 110 of rack 100. In some embodiments, with brackets oriented perpendicular to a front face of a rack, patch cables may be routed from the brackets into a common passage that runs along one side of a rack. For example, in FIGS. 3A and 3B patch cables 320 are routed in common passage 322 to various computing devices and/or network devices mounted in rack 300.

In some embodiments, racks with patch panel assemblies mounted on a top side of a rack may be installed in a data center with overhead cabling.

Figure 5:
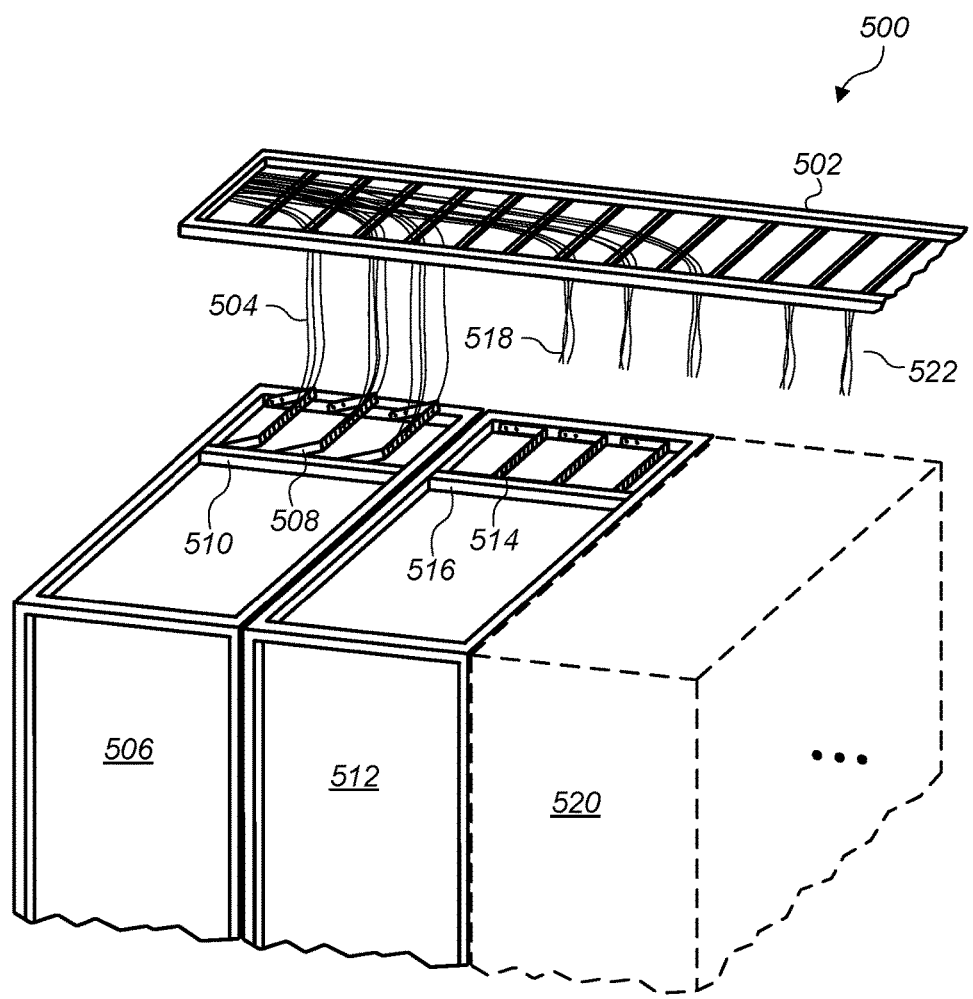
FIG. 5 is a perspective view illustrating racks with patch panels assembly mounted in the racks being installed in a data center, according to some embodiments.

FIG. 5 is a perspective view illustrating racks with patch panel assemblies mounted in the racks being installed in a data center, according to some embodiments. Data center 500 includes cable tray 502 and cables 504 in cable tray 502. Rack 506 is illustrated in an installed configuration with brackets 508 of patch panel assembly 510 in an open position, and cables 504 coupled with patch cable connectors coupled into bracket 508 of patch panel assembly 510. Rack 512 may be a rack that has been delivered to a data center with computing device and/or network devices pre-installed in the rack and coupled to patch cable connectors coupled in brackets 514 of patch panel assembly 516 but has not yet been installed. Cables 518 extending down from cable tray 502 may be configured to couple with patch cable connectors coupled in brackets 514 of patch panel assembly 516 of rack 512. In order to complete installation of rack 512, brackets 514 of patch panel assembly 516 may be articulated into an open position and secured in the open position via one or more securing mechanisms. Cables 518 may be coupled with patch cable connectors in brackets 514 that are secured in the open position. In some embodiments, racks may be efficiently installed in a data center by including patch panels mounted in a side of a rack other than a front side of the rack or a back side of the rack such as a top side of the rack. In some embodiments, racks may be shipped to a data center with computing devices and/or network devices pre-installed in the racks and patch cables pre-installed in the racks from the computing devices and/or network devices to a patch panel assembly, such any of the patch panel assemblies described in FIGS. 1-4. For example, FIG. 5 illustrates space 520 and cables 522 that are pre-configured to accept an additional rack in data center 500.

Figure 6:
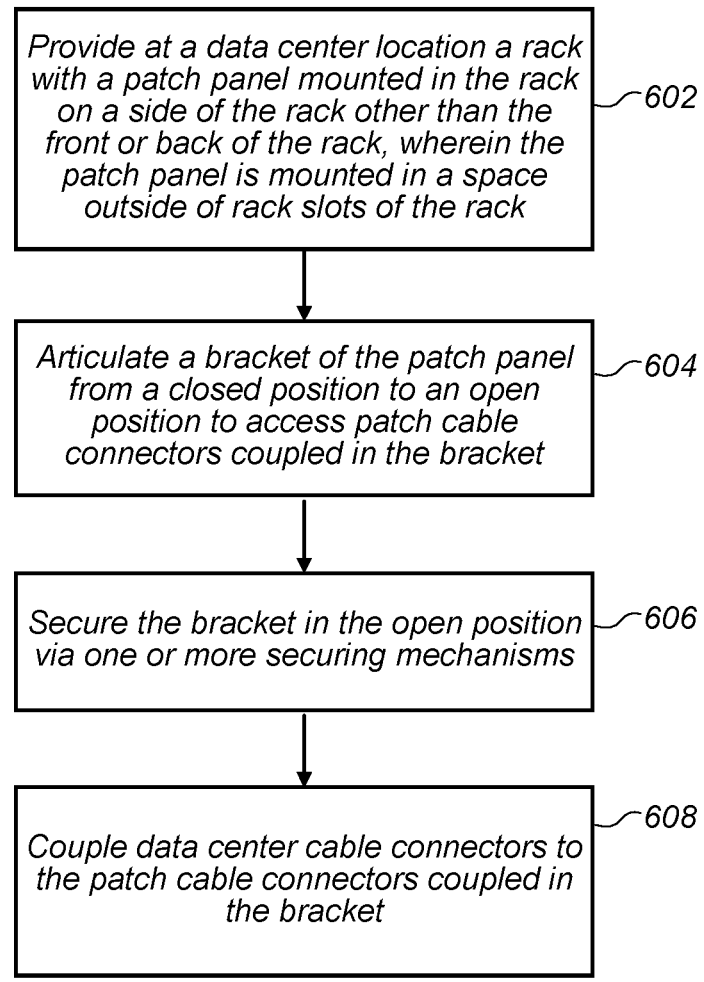
FIG. 6 illustrates installing racks with patch panel assemblies with articulating brackets in a data center, according to some embodiments.

FIG. 6 illustrates a method of installing racks with patch panel assemblies with articulating brackets in a data center, according to some embodiments.

At 602 a rack with a patch panel assembly mounted in the rack on a side of the rack other than the front side of the rack or the back side of the rack is provided at a data center location. The patch panel assembly is mounted in a space in the rack that is separate from space occupied by rack slots in the rack. The rack with a patch panel assembly mounted in the rack could be any of the racks with patch panel assemblies mounted in the racks described in FIGS. 1-5. In some embodiments, a rack may be shipped to a data center location with a patch panel assembly and patch cabling pre-installed in the rack. In addition, in some embodiments a rack may also be shipped with computing device and/or networking devices pre-installed in the rack. For example, a rack may be received at a data center location with servers and network switches pre-installed in the rack. Patch cables may also be pre-installed in the rack and connect the servers and network switches to a patch panel assembly mounted in the rack. In such embodiments, computing devices and network switches of a rack may be pre-configured to connect to a data center network by connecting patch cable connectors coupled in the patch panel assembly to data center network cables that are pre-installed in a data center. The rack may be shipped to the data center with brackets of the patch panel assembly mounted in the rack in a closed position such that the brackets of the patch panel do not extend beyond an outer edge of a frame of the rack. This may allow racks to be shipped via established shipping practices without having to adjust to any changed rack dimensions.

At 604, after a rack is placed in a location in the data center at which the rack is to be installed, a bracket of the patch panel assembly mounted in the rack is articulated from the closed position to an open position. In the open position, patch cable connectors coupled in one or more openings of the bracket may be accessible to accept connectors of data center cables. In some embodiments a patch panel assembly mounted in a rack may include multiple brackets mounted in the patch panel.

At 606, the bracket(s) of the patch panel are secured in the open position via one or more securing mechanisms. In some embodiments a securing mechanism may be a pin, clip, tie-wrap or other device that is inserted through a hole in a bracket to secure the bracket in the open position. In some embodiments, other suitable mechanisms may be used to secure a bracket in the open position. In some embodiments, a bracket may be configured to be secured in more than one open position. For example, a patch panel assembly that includes multiple brackets may include brackets that are configured such that adjacent brackets can be secured in different open positions at different heights above the rack to allow for better access to patch cable connectors coupled in openings of the brackets.

At 608, cable connectors of data center cables are coupled to the patch cable connectors coupled in the brackets of the patch panel assembly to couple computing devices and/or network devices mounted in the rack to data center networks.

The various methods as illustrated in the Figures and described herein represent exemplary embodiments of methods. The order of methods may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A rack comprising:
   a plurality of rack slots configured to accept installation or removal of computing devices in the rack slots;
   a patch panel assembly mounted in the rack, wherein the patch panel assembly comprises a bracket configured to articulate from a closed position to an open position such that patch cable connectors mounted in an opening in the bracket of the patch panel are accessible; and
   a passage configured for routing respective patch cables from respective ones of the rack slots to the patch panel assembly,
   wherein the patch panel assembly further comprises a cable management panel configured to guide the respective patch cables connected to the patch cable connectors when the bracket is articulated.

2. The rack of claim 1, wherein the bracket of the patch panel assembly is coupled to a structural member of the rack via a pivot mechanism, wherein the bracket of the patch panel assembly is configured to articulate relative to the rack between:
   a first position, wherein in the first position the bracket of the patch panel assembly does not extend beyond an outer edge of the rack; and
   a second position, wherein in the second position an end of the bracket comprising an opening configured to receive the respective patch panel cables extends beyond the outer edge of the rack.

3. The rack of claim 1, wherein the patch panel assembly further comprises a securing mechanism configured to secure the bracket of the patch panel assembly in the open or closed position.

4. The rack of claim 3, wherein the patch panel assembly is mounted in a volume of space above the rack slots, wherein a depth of the volume of space is defined by a thickness of a structural member of the rack.

5. The rack of claim 4, wherein the patch panel assembly further comprises an additional bracket comprising an opening configured to accept patch cable connectors, wherein the bracket and the additional bracket are mounted in the volume of space above the rack slots.

6. A device comprising:
   a patch panel assembly configured to be mounted in a rack, wherein the patch panel assembly comprises a bracket configured to articulate from a closed position to an open position such that patch cable connectors mounted in an opening in the bracket of the patch panel are accessible to receive respective patch cables; and
   wherein the patch panel assembly further comprises a cable management panel configured to guide the respective patch cables connected to the patch cable connectors when the bracket is articulated.

7. The device of claim 6, wherein the patch panel assembly further comprises a pivot mechanism, wherein the pivot mechanism is configured to couple the bracket of the patch panel assembly to a structural member of the rack and allow the bracket of the patch panel assembly to articulate into and out of a volume of space on the side of the rack when the patch panel assembly is mounted in the rack.

8. The device of claim 7, wherein the patch panel assembly is configured such that when the bracket of the patch panel assembly is articulated to a first position, the bracket of the patch panel assembly fits within the volume of space on the side of the rack without extending beyond an outer edge of the rack.

9. The device of claim 7, wherein the patch panel assembly is configured such that when the bracket of the patch panel assembly is articulated to a second position, the bracket of the patch panel assembly extends outside of the volume of space on the side of the rack such that the opening of the bracket of the patch panel assembly is accessible to allow respective patch cable connectors coupled in the opening of the bracket to be coupled with patch cable connectors of cables outside the rack.

10. The device of claim 6, wherein the cable management panel extends along a bottom side of the patch panel assembly.

11. The device of claim 7, wherein the patch panel assembly further comprises an additional bracket comprising an opening configured to accept patch cable connectors, and an additional pivot mechanism, wherein the additional pivot mechanism is configured to couple the additional bracket of the patch panel assembly to the structural member of the rack and allow the additional bracket of the patch panel assembly to articulate into and out of the volume of space on the side of the rack when the patch panel assembly is installed in the rack.

12. The device of claim 11, wherein the patch panel assembly further comprises a securing mechanism and an additional securing mechanism, wherein:
   the securing mechanism is configured to secure the bracket in multiple different open positions, and
   the additional securing mechanism is configured secure the additional bracket in multiple different open positions independently of the securing mechanism that secures the bracket.

13. The device of claim 6, wherein the opening in the bracket of the patch panel assembly is configured to accept a patch cable connector comprising multiple fiber optic cable connectors in a same patch cable plug.

14. The device of claim 6, wherein patch panel assembly is configured to mount in a rack such that the opening in the bracket of the patch panel assembly is oriented in a line perpendicular to a front face of the rack in which the patch panel assembly is installed.

15. A method comprising:
   providing a rack comprising multiple rack slots at a data center location, wherein the rack comprises a patch panel mounted in or to the rack, wherein the patch panel further comprises a cable management panel; and
   articulating a bracket of the patch panel from a closed position to an open position such that patch cable connectors mounted in an opening in the bracket of the patch panel are accessible, wherein said articulating the bracket of the patch panel comprises guiding patch cables connected to the patch cable connectors, by the cable management panel.

16. The method of claim 15 wherein the rack is shipped to the data center location with the patch panel pre-installed in the rack.

17. The method of claim 15 wherein in the closed position the bracket of the patch panel fits within a volume of space within the rack that is separate from a volume of space occupied by the rack slots of the rack, and wherein in the open position the bracket of the patch panel extends outside the volume of space within the rack.

18. The method of claim 15, wherein the rack slots extend between a front side of the rack and a back side of the rack, and wherein the patch panel is mounted in the rack on another side of the rack other than the front side of the rack and other than the back side of the rack along an outward facing surface of the rack, wherein the patch panel does not occupy space in the rack occupied by the rack slots of the rack.

19. The method of claim 15, wherein the patch panel is mounted on a top side of the rack, the method further comprising:
   coupling respective ones of the patch cable connectors mounted in the opening of the bracket to overhead cables of the data center.

20. The method of claim 15, further comprising:
   articulating another bracket of the patch panel from a closed position to an open position such that additional patch cable connectors mounted in an opening in the other bracket of the patch panel are accessible.

* * * * *